United States Patent [19]
Smoot

[11] 4,167,711
[45] Sep. 11, 1979

[54] PHASE DETECTOR OUTPUT STAGE FOR PHASE LOCKED LOOP

[75] Inventor: George W. Smoot, Sunrise, Fla.

[73] Assignee: Motorola, Inc., Schaumburg, Ill.

[21] Appl. No.: 910,056

[22] Filed: May 26, 1978

[51] Int. Cl.² ............................................. H03B 3/04
[52] U.S. Cl. ........................................ 331/17; 331/8; 331/25
[58] Field of Search ...................... 331/8, 17, 16, 1 R, 331/25

[56] References Cited
U.S. PATENT DOCUMENTS

| | | | |
|---|---|---|---|
| 3,582,809 | 6/1971 | Rigby | 331/8 |
| 3,603,890 | 9/1971 | Camenzind et al. | 331/8 |
| 3,701,039 | 10/1972 | Lang et al. | 331/17 |
| 3,980,968 | 9/1976 | Ma | 331/17 |
| 4,068,188 | 1/1978 | Yokoyama | 331/8 |

FOREIGN PATENT DOCUMENTS 987748  7/1968  Canada ...................................... 331/8

Primary Examiner—Siegfried H. Grimm
Attorney, Agent, or Firm—Margaret Marsh Parker; James W. Gillman

[57] ABSTRACT

A current-mode output stage for a digital phase detector has its output current magnitude controllable, with the output polarity determined by the phase detector. Either two or three output states can be provided.

7 Claims, 6 Drawing Figures

| IN 1 | IN 2 | OUTPUT |
|------|------|--------|
| 0 | 0 | SINK 1 |
| 0 | 1 | FLOAT |
| 1 | 0 | FLOAT |
| 1 | 1 | SOURCE 1 |

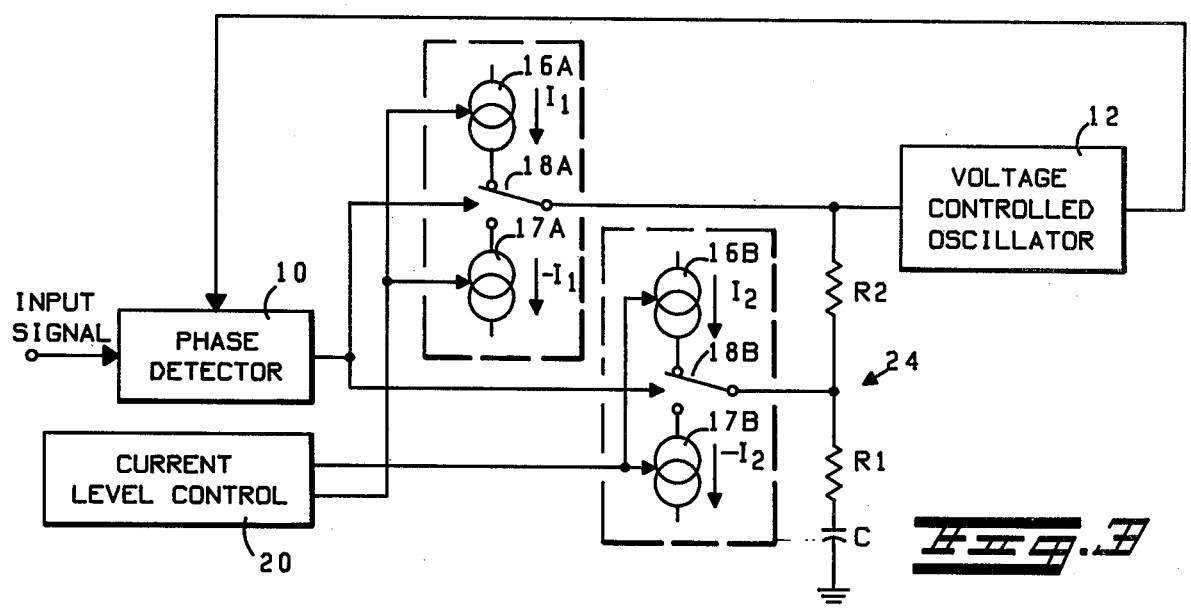
Fig. 3
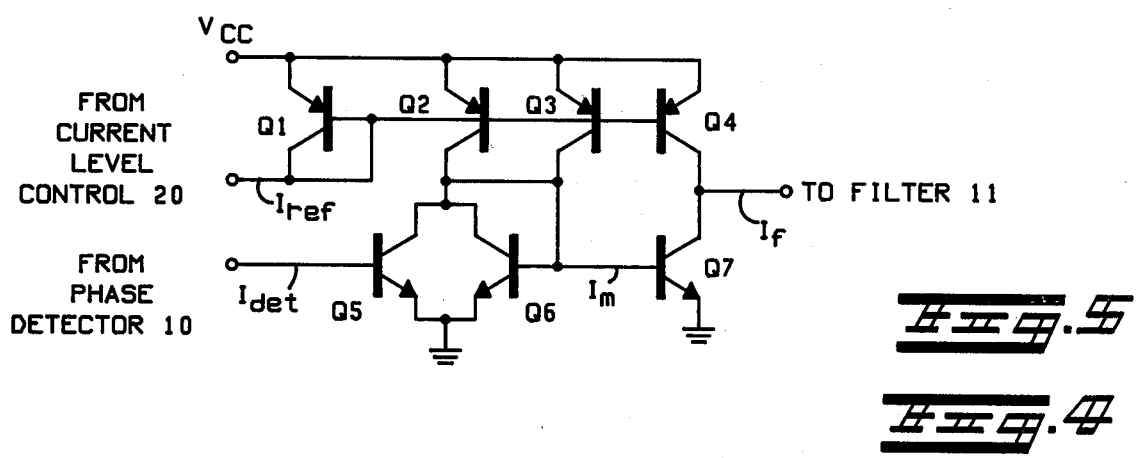
Fig. 5
Fig. 4
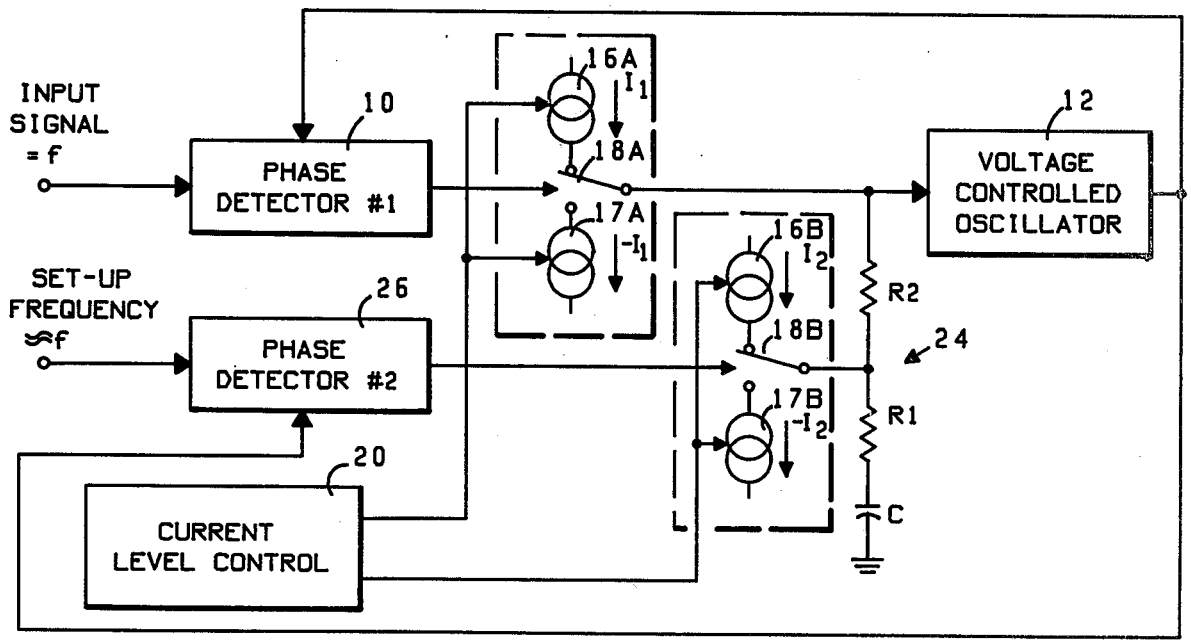

PHASE DETECTOR OUTPUT STAGE FOR PHASE LOCKED LOOP

BACKGROUND OF THE INVENTION

This invention relates to the field of digital phase detectors as for a phase locked loop and more particularly to an integratable current-mode output stage therefor.

In a phase locked loop, the frequency of a local oscillator signal is controlled in response to the output of a phase detector which compares the oscillator frequency with an input signal frequency. The phase detector output is filtered to provide a DC control signal to the local oscillator. An active filter may be used in those systems requiring a high DC gain characteristic. To aid frequency acquisition, it is known to provide a switchable bandwidth which is wide when the local oscillator is far from the desired frequency and narrow when the difference is very small. In systems for accomplishing this the switching itself typically causes perturbations in the circuit which affect the error sensing mechanism.

SUMMARY OF THE INVENTION

It is therefore an object of the present invention to provide a current-mode output stage for a phase detector.

It is a more particular object to provide an output stage with an externally controllable current amplitude, the current polarity determined by the output of the digital phase detector.

It is another object to provide the capability for two or three output states from the phase detector output stage.

These objects and others are provided in an integrated circuit utilizing a current source/sink pair with current mirrors. The input signal to the phase detector output stage determines the polarity of the output signal and a controllable reference current determines the magnitude of the output signal current. Two pairs of current source/sinks may be used, with outputs coupled to different filter networks and switched to provide alternative operations. Instead of switching the output currents, the input or reference currents of the two pairs of current source/sink may be controlled to give improved performance over other methods of change of bandwidth. The second pair of current source/sinks may be controlled by the output of a second phase detector coupled to a "set-up" or reference frequency near the frequency of the input signal of the first phase detector, so that the phase locked loop can be stabilized at a frequency near the desired one before the desired one is coupled to the phase locked loop.

BRIEF DESCRIPTION OF THE DRAWINGS

In the drawing,

FIG. 3 is a diagram of an embodiment which combines features of the circuits of FIGS. 1 and 2.

FIG. 4 is a drawing of still another embodiment of the invention.

FIG. 5 is a circuit diagram of an output stage having two output states.

DETAILED DESCRIPTION OF THE PREFERRED EMBODIMENT

Figure 1:
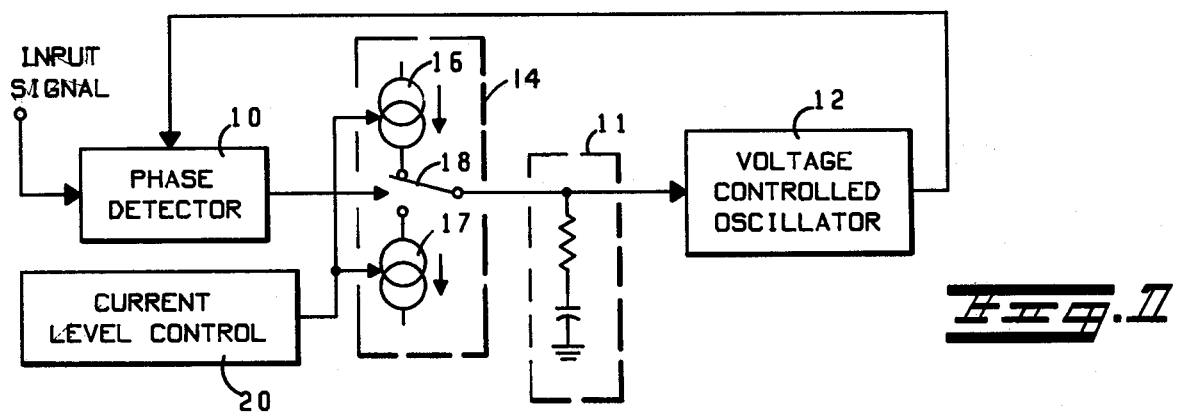
FIG. 1 is a block diagram of a circuit in accordance with the invention.

The present invention will be best understood in relation to the drawing in which like parts have like reference numerals throughout.

In FIG. 1 a phase locked loop is comprised of a phase detector 10, a filter 11 and a voltage-controlled oscillator (VCO) 12, the VCO 12 output being coupled back to one input of the phase detector 10. Inside a dashed line 14 is the output stage of the phase detector 10 indicated symbolically as a current source 16, a current sink 17 and switch 18. The polarity of the current going to the filter 11 and the VCO 12 is controlled by the phase detector 10. A current level control circuit 20 controls the magnitude of the current and thus the loop bandwidth and damping. With this configuration, optimal damping can be obtained at only one bandwidth, however, it is a usable range of damping.

Figure 2:
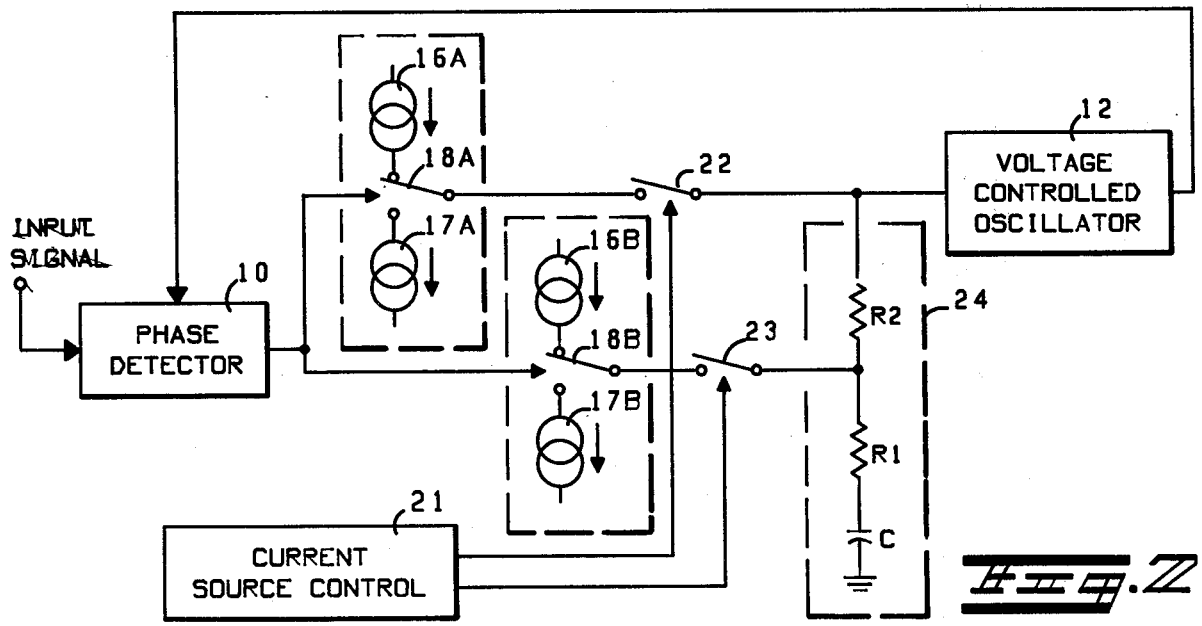
FIG. 2 is a diagram of another embodiment of the invention.

In FIG. 2 a current source/sink pair 16A, 17A with switch 18A and another current source/sink pair 16B, 17B and switch 18B are controlled by a current source control 21; i.e., are switched into the circuit alternatively via switches 22 and 23. The respective current magnitudes of the pairs are fixed. As the pairs are switched the loop bandwidth is changed, due mainly to the magnitudes of the current, and the damping is changed by applying the output currents to different points in the filter 24. The filter 24 could be as shown in FIG. 2 or could also be two separate networks, each coupled to the VCO 12.

In FIG. 3 are combined some of the features of the circuits of FIGS. 1 and 2. The switches 22 and 23 of FIG. 2 are not needed here since the current source/sink pairs 16A, 17A and 16B, 17B can be turned off completely. The two input points on the filter 24 still provide optimal control of both loop bandwidth and damping.

The circuit configuration of FIG. 3 can operate in two different modes. In one mode, the magnitude of each of the currents in the source/sink pairs is either zero or a maximum value, where $I_1$ max is less than $I_2$ max, $I_1$ being the current in source/sink pair 16A, 17A and $I_2$ the current in source/sink pair 16B, 17B. The current level control 20 controls the levels of $I_1$ and $I_2$ with only one source/sink pair operative in any one time. The phase detector 10 will determine whether the operative pair is sourcing or sinking current. When a narrow band characteristic is desired in the PLL current source/sink pair 16A, 17A would be operative and current source/sink pair 16B, 17B would be turned off.

In a second and more general mode of operation of the circuit configuration of FIG. 3, the magnitudes of $I_1$ and $I_2$ can be varied from zero to some maximum value. Thus the bandwidth of the PLL can be varied about some point while its damping remains within a usable range. When it is necessary to widen the bandwidth to a point such that the damping would not remain within a usable range, the first source/sink pair is turned off and the second pair is turned on, and the damping again remains within a usable range. In this embodiment, two different bandwidths, each with its associated damping, are used. It will, however, be apparent that multiple bandwidth/damping steps could be included.

The configuration of FIG. 4 is similar to those previously described, but it is applicable where it is desired to combine, in one PLL, narrow bandwidth with rapid locking on any given frequency. Prior to receiving the desired input frequency f, the VCO is stabilized on a "set-up" frequency near f which has been supplied to a second phasedetector phase detector The output of the VCO 12 is coupled to one of the inputs of each of the phase detectors 10 and 26. The output signal from the phase detector 26 is coupled to control the polarity of the output current of the current source/sink pair 16B, 17B. By proper selection of the magnitude of the current $I_2$ and the values of R1 and C, a wide-band, optimally damped PLL configuration results and the VCO 12 will rapidly stabilize on the set-up frequency. At this point in time, the current source/sink pair 16B, 17B is disenabled and the current source/sink pair 16A, 17A is enabled. Proper selection of the values of $I_1$ and R2 in conjunction with the previously selected values of R1 and C will provide a narrow band PLL configuration centered near the desired frequency f. Damping is thus optimum during both the frequency setting and frequency tracking modes of operation.

Figure 6:
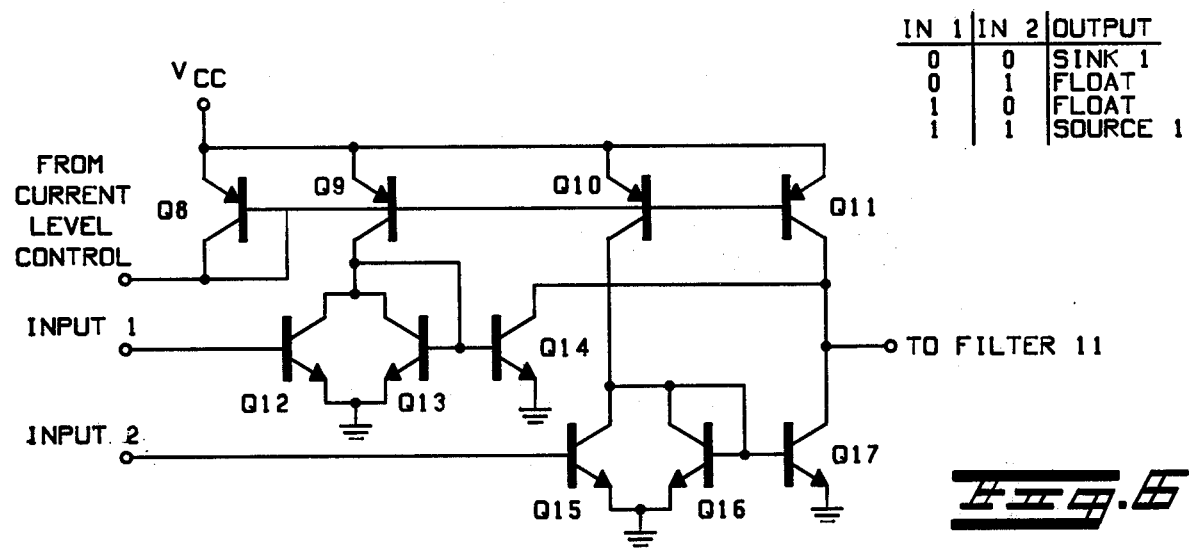
FIG. 6 is a circuit diagram of an output stage having three output states.

FIG. 5 is a circuit diagram of one embodiment of one current source/sink pair 16, 17 with switch 18, such as those in FIGS. 1-4. In the preferred embodiment all transistors will be on one integrated circuit chip, thus having the same physical properties for proper tracking. The current level control 20 draws the current $I_{ref}$ through a diode-connected transistor Q1. The level control 20 is a current sink which may be as simple or complex as required in a particular application and may also be continuously variable or switchable as desired. Transistors Q2, Q3 and Q4 with Q1 act as current mirror to $I_{ref}$. Q3 and Q4 thus supply 2 $I_{ref}$ to Q6 which, with Q7, mirrors this current. If $I_{det}$ from the phase detector 10 is sufficiently high, $I_m$ to Q7 will be zero and $I_f$ to the filter 11 will be the current sourced by Q4, or $I_{ref}$. If no current is supplied from the phase detector 10 to Q5, $I_m$ will be 2 $I_{ref}$, i.e. twice the current sourced by Q4, and the output to the filter 11 will be $-I_{ref}$. Thus a switchable bipolar current with magnitude equal to a reference current is provided, having characteristics similar to those of a loop utilizing an active filter. Also, since the output of the circuit is a current rather than a voltage, the loop is not affected by variations in the loop amplifier operating point and the phase detector output reflects more nearly the true phase error of the loop. The circuit of FIG. 6 works in much the same manner as that of FIG. 5 except that it is designed for use with phase detectors which utilize three output states: "source," "sink" and "float." The current level control 20 draws current from the supply VCC through Q8 which has its base-collector connected to the bases of Q9, Q10 and Q11, thus forming current mirrors of the reference current. The current from the collector of Q9 flows into diode-connected Q13 and is mirrored by Q14 while the current from the collectors of Q10 flows into diode-connected Q16 and is mirrored by Q17. In this condition the net output current is a sink of the same magnitude as the current reference. If, however, either Q12 or Q15 is supplied base current by the phase detector, then the associated current mirror will become inoperative, and the driver stage output will be as specified in the table of FIG. 6 where a "1" indicates that base current is supplied and a "zero" indicates that base current is not supplied. Thus three level of output are available.

What is claimed:

1. In a phase locked loop including a phase detector, a filter, and a voltage controlled oscillator, an output stage for the phase detector comprising combination:
   a first current source;
   a first current sink;
   control means for controlling the level of current in the current source and the current sink;
   first signal controlled switching means adapted to couple an output of one of the current source and current sink to the filter of the phase locked loop in response to the output signal of the phase detector of the phase locked loop;
   a second current source;
   a second current sink, the level of current in the second current source and second current sink being controlled by the control means alternately with control of the first current source and the first current sink; and
   second signal controlled switching means adapted to couple one of the second current source and second current sink to the filter of the phase locked loop in response to the output signal of the phase detector of the phase locked loop.

2. In a phase locked loop in accordance with claim 1, the filter having first and second input terminals for providing first and second loop bandwidths, one of the first current source and first current sink being coupled to the first filter input terminal, and one of the second current source and the second current sink being coupled to the second filter input terminal.

3. In a phase locked loop including a phase detector, a filter, and a voltage controlled oscillator, an output stage for the phase detector comprising in combination:
   a first current source;
   a first current sink;
   control means for controlling the level of current in the first current source and the first current sink;
   first signal controlled switching means adapted to couple an output of one of the first current source and current sink to the filter of the phase locked loop in response to the output signal of the phase detector of the phase locked loop;
   a second current source;
   a second current sink, the level of current in the second current source and second current sink being controlled by the control means alternately with control of the first current source and first current sink;
   a frequency source for supplying a signal frequency of substantially the frequency of the input signal of the phase detector of the phase locked loop;
   a second phase detector coupled to the frequency source and to the output of the voltage controlled oscillator; and
   second signal controlled switching means adapted to couple one of the second current source and second current sink to the filter of the phase locked loop in response to the output signal of the second phase detector.

4. In a phase locked loop an output stage in accordance with claim 3, the filter having first and second input terminals for providing first and second loop bandwidths, one of the first current source and first current sink being coupled to the first filter input terminal, and one of the second current source and the second current sink being coupled to the second filter input terminal.

5. In a phase locked loop including a phase detector, a filter, and a voltage controlled oscillator, an output stage for the phase detector comprising in combination:
  a first current source;
  a first current sink, the first current source and first current sink having a first predetermined current level;
  a second current source;
  a second current sink, the second current source and second current sink having a second predetermined current level;
  control means;
  first switching means coupled to the filter of the phase locked loop;
  second switching means coupled to the filter of the phase locked loop, the first and second switching means being enabled alternately by the control means;
  third switching means controlled by the output of the phase detector of the phase locked loop for coupling an output of one of the first current source and first current sink to the first switching means; and
  fourth switching means controlled by the output of the phase detector of the phase locked loop for coupling an output of one of the second current source and second current sink to the second switching means.

6. In a phase locked loop in accordance with claim 5, the filter having first and second input terminals for providing first and second loop bandwidths, the first switching means being coupled to the first filter input terminal and the second switching means being coupled to the second filter input terminal.

7. In a phase locked loop an output stage in accordance with claim 1, and wherein the output stage includes means for providing three levels of output current to the filter.

* * * * *